United States Patent [19]

Voboril

[11] Patent Number: 4,972,249

[45] Date of Patent: Nov. 20, 1990

[54] SEMICONDUCTOR COMPONENT INCREASING THE BREAKDOWN VOLTAGE

[75] Inventor: Jan Voboril, Nussbaumen, Switzerland

[73] Assignee: BBC Brown Boveri AG, Baden, Switzerland

[21] Appl. No.: 332,435

[22] Filed: Mar. 31, 1989

Related U.S. Application Data

[63] Continuation of Ser. No. 52,035, May 20, 1987, abandoned.

[30] Foreign Application Priority Data

May 30, 1986 [CH] Switzerland ............. 2191/86-2

[51] Int. Cl.$^5$ ............................................. H01L 29/36
[52] U.S. Cl. ....................................... 357/52; 357/13; 357/55
[58] Field of Search ................................ 357/52, 13, 55

[56] References Cited

U.S. PATENT DOCUMENTS 4,374,389 2/1983 Temple ................................. 357/52

FOREIGN PATENT DOCUMENTS

| 0011443 | 5/1980 | European Pat. Off. | 357/38 |
| 1614991 | 1/1971 | Fed. Rep. of Germany | 357/52 |
| 3520699 | 1/1986 | Fed. Rep. of Germany | 357/34 |
| 1551252 | 5/1968 | France | 357/52 |
| 2033154 | 5/1980 | United Kingdom | 357/52 |

OTHER PUBLICATIONS

*Proc. 5th Conf. on Solid State Dev.*, Tokyo 1973 Suppl. Journal Jap. Soc. of App. Phys. vol. 43, 1974 Matsushita pp. 395-399.

*IEE Trans of Elec. Dev.* vol. ed. 24 No. 8 Aug. 1977 Temple et al., pp. 1077-1081.

Int. Jour. Elect. 1983 vol. 54 No. 1 pp. 127-137 Sundersingh et al. "Concent, . . . Diodes".

J. Phys. D: Appl. Phys. 15(1982) pp. 517-536 Tool "Methods . . . Diodes".

*Solid State Tech.*, Mar. 1980, pp. 98-105, "New Technologies . . . Semiconductor State-of-the-Art", Denning et al.

Temple, IEDm, pp. 423-426, "Junction Termination . . . P-N Junctions".

*Primary Examiner*—Jerome Jackson, Jr.
*Attorney, Agent, or Firm*—Oblon, Spivak, McClelland, Maier & Neustadt

[57] ABSTRACT

A semiconductor component including a doped semiconductor substrate into which an oppositely doped upper doping region is introduced from an upper surface to form a P-N junction which emerges at the upper surface in an edge region of the substrate. To impove the reverse breakdown voltage capacity below the surface inner section of the P-N juction, an oppositely doped lower doping region is buried in the semiconductor substrate beneath where the P-N juction emerges at the upper surface. The oppositely doped, lower doping region reduces the charge carrier concentration in the critical area. The structure retains the planar surface and is easily producible.

3 Claims, 3 Drawing Sheets

SEMICONDUCTOR COMPONENT INCREASING THE BREAKDOWN VOLTAGE

This application is a Continuation Division of application Ser. No. 052,035, filed on May 20, 1987, now abandoned.

BACKGROUND OF THE INVENTION

1. Field of the Invention

The present invention relates to a semiconductor component with a P-N junction extending inside a doped semiconductor substrate and also a process for the production thereof. Such a component is known, for example, from the paper by V. P. Sunderingh and A. A. Ghatol, Int. J. Electronic, Vol. 54, No. 1 (1983), p. 127 ff.

2. DISCUSSION OF BACKGROUND

In semiconductor components with a P-N junction extending inside a semiconductor substrate, the breakdown strength of the reverse-biased P-N junction is determined not so much by the bulk properties of the semiconductor substrate, but primarily by surface effects at the points at which the P-N junction in the substrate emerges at the surface.

In order to be able to take advantage of the full reverse voltage handling capacity of the P-N junction to be expected from the bulk properties of the semiconductor material, the electric field has to be influenced in a suitable manner in the region where the P-N junction emerges at the surface in order to limit the maximum of the field strength prevailing at that point. The reason for this is that a breakdown already occurs at the surface at lower field strengths than in the bulk of the semiconductor material.

The electric field to be influenced is produced in a known manner by the space charge region which forms at the P-N junction and which is a consequence of the diffusion of the free charge carriers and the externally applied voltage.

Various measures have therefore been proposed in the prior art for reducing the maximum field strength occurring at the surface of a semiconductor component (a review of this can be found in the following two documents: J. A. Tove in J. Phys. D: Appl. Phys., 15 (1982), p. 517–536 and also R. Denning and J. White and Solid State Technology, March 1980, p. 98–105):

(1) One of the known measures is to reduce the quantity of available charges in the critical edge region of the component where the P-N junction emerges at the surface and therby reduce the field strength in the space charge region. This can be achieved.
  (a) by a negative bevelling in the edge region or etching out an isolating trench, which both cut the P-N junction;
  (b) by a mesa structure in the edge region of one doping region;
  (c) by a diffused guard ring surrounding the P-N junction.
(2) A further measure, known from the paper by V. P. Sudersingh et al mentioned in the introduction is to cause a heavily doped doping region of the P-N junction to terminate in the edge region with doping which becomes lighter, thereby reducing the available charge carriers.
(3) A third measure, known from a paper by V. A. K. Temple in IEDM Techn. Digest 1977, p. 423–426, provides a lateral doping gradient in the edge region, which gradient, if a planar surface is retained, has the same effect as the measures mentioned under point (1).
(4) Furthermore, influencing the electric field in the region where the P-N junction intersects the surface by means of an electrode field plate situated above it is known (for example, from the paper by P. A. Tove cited).
(5) Finally, reference must further be made to those measures which relate not to operations on the thinner, highly doped doping region but to operations on the thick, lightly doped region, i.e. the basic semiconductor substrate. Here the following are known:
  (a) positive bevelling in the edge region; and
  (a) etching away the substrate meterial (substrate etch).

In relation to all the known measures listed it should be remarked that those variants in which the planar surface of the component is retained are increasingly gaining in importance.

Furthermore, as a rule the doping region situated at the top (which is usually p-type) has a substantially higher doping concentration and a very much lower thickness than the substrate layer situated below it (which, correspondingly, is usually n-type). Provided, therefore, the known measures (as listed under points (1) to (4) relate to operations in the thin, more highly doped upper doping region, they have the disadvantage that they have to be carried out with high accurancy. Even a slight deviation from the ideal state makes the success of the measure at least uncertain.

Finally, the variants listed under point (5) are indeed largely insensitive to the orientation of the bevel angle or to the etching depth. However, the beveling a) requires machnaical machining of the semiconductor material, which is associated with defect formation and makes a subsequent etching necessary. Because of the thickness of the substrate, the etching (b) requires very long etching times which impose increased requirements on the resistance of the etching mask. In addition to this, this structure has an increased susceptibility to fracture.

SUMMARY OF THE INVENTION

The object of the present invention is therefore to provide a semiconductor component which has an increased breakdown strength with retention of the planar surface and can be produced relatively simply.

The object is achieved in a semiconductor component including a doped semiconductor substrate and an oppositely doped upper doping region projecting into the substrate from an upper side, a P-N junction extending between the doped semiconductor substrated and the oppositely doped, upper doping region and emerging at the upper surface in an edge region of the component, and a lower doping region provided to reduce charges in the vicinity of the surface intersection of the P-N junction. The lower doping region has opposite doping relative to the semiconductor substrate, is introduced into the substrate from the lower side of the semiconductor substrate, and terminates in the bulk of the semiconductor substrate below the P-N junction.

The essence of the invention is to provide, in the edge region of the semiconductor component in which the P-N junction formed by a thin upper doping region and the substrate situated below it emerges at the surface, an oppositely doped lower doping region, which limits the charge carriers available in the bulk of the substrate and thus reduces the maximum field strength where the P-N junction intersects the surface, in the bulk of the substrate below the P-N junction.

According to a preferred exemplary embodiment of the invention, the lower doping region is even completely buried in the bulk of the semiconductor substrate (buried zone), an additional barrier layer, which limits the lower doping region in the downward direction, being introduced into the substrate in the direction of the lower side so that the lower doping region is surrounded on all sides by oppositely doped substrated material.

In the novel process for producing the semiconductor component, the oppositely doped lower doping region is first introduced into the doped semiconductor substrate from the second, lower side by a deep, selective diffusion and the upper oppositely doped doping region is only produced in a second step by a masked diffusion from the first, upper side of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
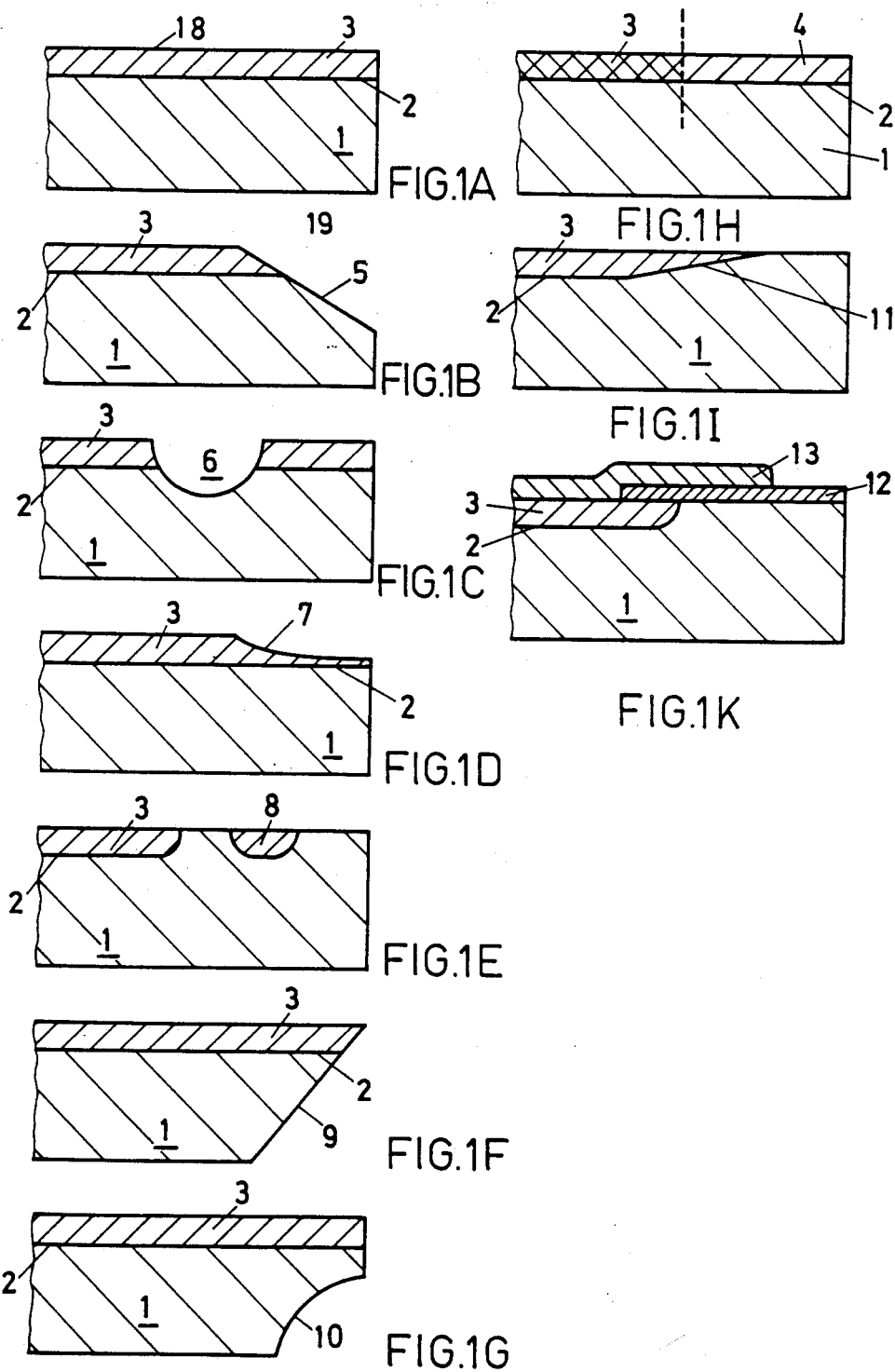
FIGS. 1A–1K are cross-sectional views showing various known measures for reducing the maximum field strength in the edge region of a semiconductor component with a P-N junction emerging at the surface.

Referring now to the drawing, wherein like reference numerals designate identical or corresponding parts throughout the several views, in the series of FIGS. 1A to 1K, a number of different measures are illustrated for reducing the electric field strength in the region of the surface intersection of a P-N junction, as they are known from the prior art.

Starting from a basic component structure (FIG. 1A) which, between a first upper side 18 and a second lower side 19, has a semiconductor substrate 1 which is generally more lightly doped and into which a more highly and oppositely doped upper doping region 3 is introduced from the upper side 18 and forms a P-N junction 2 together with the semiconductor substrate 1, a first known measure is to produce a negative bevelling 5 at the edge of the substrate by mechanical machining (FIG. 1B).

A trench 6 (FIG. 1C), which is etched in the edge region and cuts the P-N junction 2, is comparable in effect with the negative bevelling.

The P-N junction 2 is not itself reached in another measure, which is shown in FIG. 1D, of shaping the upper doping region 3 in the form of a mesa structure 7 with a flat plateau and regions which drop away at the edges and which terminate more flatly towards the outside.

In addition to the measures shown in FIGS. 1B to 1D and associated with geometrical modifications at the top of the semiconductor substrate 1, FIGS. 1E, 1H and 1I show variations in which the upper side 18 is retained as a planar surface and the measures either provide a guard ring 8 of the same doping surrounding the upper doping region 3 (FIG. 1E) or cause the upper doping region 3 to terminate in a more lightly doped edge region 4 (FIG. 1H) or with a lateral doping gradient 11 (FIG. 1I).

A further known measure which leaves the semiconductor unchanged in its original geometry is the provision of a field plate 13 above the P-N junction 2 emerging at the surface with an insulating layer 12 situated inbetween (FIG. 1K).

Finally, two other known measures relate to geometrical modifications of the semiconductor substrate 1 on the side facing away from the upper doping region 3 in the lightly doped substrate section. These include a positive bevelling 9 (FIG. 1F) which, Like the negative bevelling in FIG. 1B, requires mechanical machining, and also substrate etching 10 in the lower substrate region (FIG. 1G).

Figure 2:
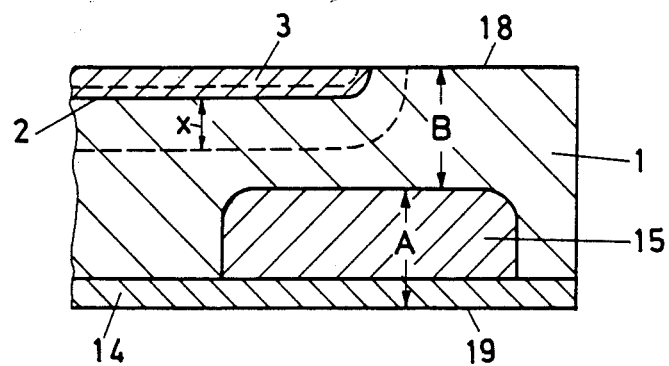
FIG. 2 is a cross-sectional view showing a first exemplary embodiment of a semiconductor component according to the invention.

On the other hand, the geometrical shape of the semiconductor substrate 1 retains its original shape in a semiconductor component according to the invention. In the first exemplary embodiment shown in FIG. 2, the starting point is a planar component in which a thin, oppositely and highly doped upper doping region 3 is introduced, for example by diffusion, into a comparatively thick, lightly doped semiconductor substrate 1 from the first, upper side 18 (FIG. 2 shows only the interesting edge region).

The upper doping region 3 forms, together with the differently doped semiconductor substrate 1, a P-N junction 2 which emerges at the surface in the edge region in the direction of the upper side 18 and forms a space charge region, indicated by a broken line, which extends into the semiconductor substrate 1 to a space charge depth x which depends on the applied voltage.

Below this point of intersection there is disposed, in the bulk of the semiconductor substrate 1, a lower doping region 15 which has a doping which is opposite to the semiconductor substrate 1, i.e. is doped in the same or in a similar manner to the upper doping region 3. The depth of the lower doping region measured from the lower side 19 is A and from the upper side B.

The lower doping region 15 is isolated in the direction of the lower side 19 of the semiconductor substrate 1 by a barrier layer 14 which is doped with impurities of the same sign as the semiconductor substrate 1. The lower doping region 15 is therefore an oppositely doped region which is completely buried in the bulk of the substrate.

The mode of operation of the lower doping region 15 can be explained in the following manner: the semiconductor substrate 1 is lightly doped compared with the upper doping region 3 (usually $n^-$ *compared with p*). *The P-N junction 2 is therefore highly asymmetrical and its space charge region* penetrates the semiconductor substrate 1 to a space charge deptch x which depends on the applied voltage (in the reverse direction) U and the doping N of the semiconductor substrate 1 as folows:

$$x = \left(\frac{2\epsilon U}{qN}\right)^{\frac{1}{2}}$$

($\epsilon$=dielectric constant for semiconductor material, usually Si, q=elementary charge).

The following space charge depths are obtained as a function of U for the example N=$2\times 10^{13}$ cm$^{-3}$:

| U: | 10 | 200 | 500 | 1000 | (V) |
|---|---|---|---|---|---|
| x: | 25.6 | 114.3 | 180.7 | 255.5 | ($\mu$m) |

Since the thickness of the upper doping region 3 is very small, with a depth of the lower doping region 15 of A=100 $\mu$m or B=180 $\mu$m, the space charge region of the P-N junction comes up against the lower doping region 15 at a reverse voltage of about 500 V. Up to this point, the lower doping region 15 is buried as electrically neutral in the bulk of the semiconductor substrate.

The space charge region consists of locally fixed charges (positive for an n$^-$-doped semiconductor substrate 1) since the oppositely charged free charge carriers (electrons) are drawn off by the applied voltage.

If the space charge region were now to penetrate the lower doping region 15, it would at most only be possible for the free charge carriers of the other type (holes) located at this point to be transported in the direction of the corresponding electrode (anode), while the locally fixed charges (negative charges) left behind would attenuate the electric field in the space charge region.

In fact, however, the penetration of the space charge region into the lower doping region 15 is small so that the effect is comparable to that of substrate etching (FIG. 1G).

For this reason the same considerations may be employed for this exemplary embodiments as have been employed, for example, in the paper by V. A. K. Temple and M. S. Adler, IEEE Transactions on Election Devices, Vol. ED-24, No. 8, Aug. 1977, p. 1077 f. for substrate etching.

The novel semiconductor component in the embodiment shown in FIG. 2 combines the advantages of two known semiconductor components, namely the advantages of the component with guard ring (FIG. 1E) and that of the component with substrate etching (FIG. 1G):

- it is a "planar" variant without operating on the (usually polished) upper side 18 of the semiconductor substrate;
- the semiconductor substrate remains unetched so that no weak points are produced and the risk of fracture is eliminated;
- there are virtually no losses in the active area of the component, i.e. the present invention is space-saving;
- the lower diping region 15 does indeed charge up analogously to the known guard ring (8 in FIG. 1E); however the P-N junction involved is at the same time buried in the substrate bulk so that surface effects do not play any part;
- the system of the lower doping region 15 may, moreover, be combined with all the known measures which relate to influencing the upper doping region. In this manner, the mode of action of these measures may be reinforced or the load removed form the edge termination.

In order to obtain a structure in accordance with the first exemplary embodiment of the invention in FIG. 2, a process can advantageously by employed whose essential steps are shown in the sequence of FIGS. 3A-3D. To explain the process, it is additionally assumed that the starting point is preferably formed by a lightly n-doped semiconductor substrate 1 into which a heavily p-doped upper doping region 3 and a p-doped lower doping region 15 and also an n-doped barrier layer 14 are diffused.

Figure 3A:
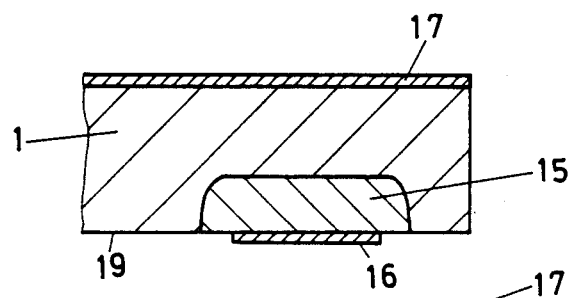
FIGS. 3A–3D are cross-sectional views showing various stages in the production of a semiconductor component as shown in FIG. 2.

The lower doping region 15 is first introduced into the lightly n-doped semiconductor substrate 1 at the beginning of the process as shown in FIG. 3A by a deep, selective p-diffustion from the second, lower side 19.

For this deep selective p-diffusion a process has proved successful which is explained in more detail in German Offenlegungsschrift 3,520,699. In this process an aluminum layer 16 is selectively deposited by cathode sputtering on the second, lower side 19 and subsequently used in a diffusion process as a diffusion source from which the p-doping of the lower doping region 15 takes place. During this diffusion process the first, upper side 18 of the semiconductor substrate 1 is protected by a suitable coating layer 17, for example of SiO$_2$. In addition, the thermal migration process which is known per se is alos suitable for the deep diffusion. The lower doping region 15 may, however, also be introduced into the substrate by means of conventional diffusion, for example using boron, if the barrier layer 14 is subsequently deposited epitaxially on the substrate.

Figure 3B:
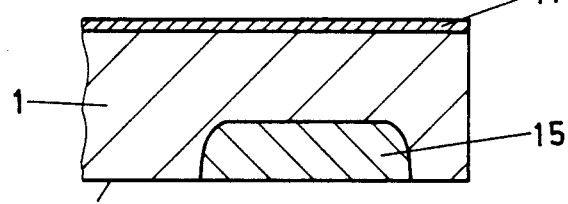

Following the drive-in of the lower doping region 15, the second, lower side 19, indicated in FIG. 3B, is lapped and etched in order to achieve a surface which is as defect-free as possible on the bottom of the substrate.

This surface processing step is followed by a second diffusion process in which a donor, for example phosphorus, is diffused into the semiconductor substrate 1, again from the lower side 19, over the whole surface and forms the n-type barrier layer 14 there which limits the lower doping region 15 in the downward direction so that the region 15 is completely enclosed in the bulk.

Figure 3C:
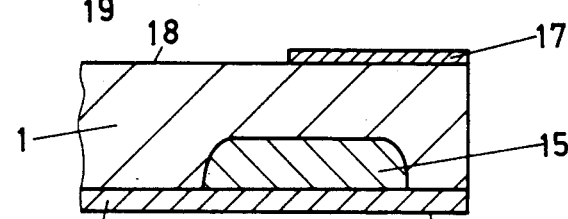
Figure 3D:
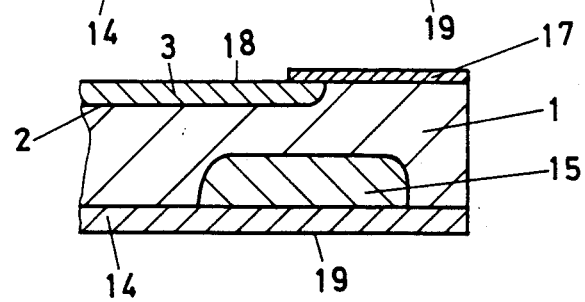

In this diffusion step, too, the coating layer 17 is still present over the whole surface on the upper side 18 of the semiconductor substrate in order to prevent an uncontrolled doping at the top. After completion of the second diffusion, the coating layer 17 is then patterned in a suitable manner, for example photolithographically, in order to act as a mask in the diffusion of the upper doping region (FIG. 3C).

The upper doping region 3 (FIG. 3D) is then introduced into the substrate in a third diffusion step from the upper side 18 through the coating layer 17 acting as mask as a heavily p-doped region, for example by boron diffusion or implanation, and then forms the P-N junction 2.

Figure 4:
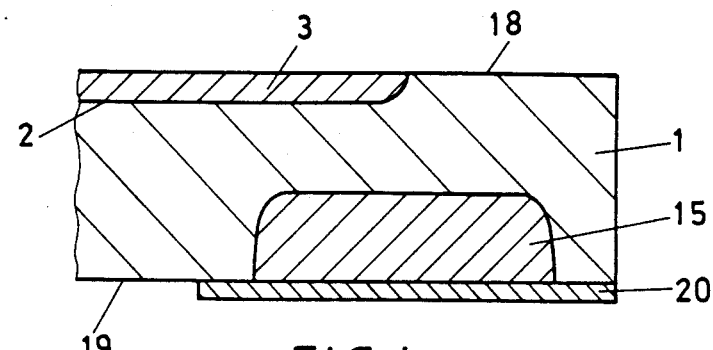
FIG. 4 is a cross-sectional view showing a second exemplary embodiment of a semiconductor component according to the invention.

Another sequence of process steps is necessary in order to achieve a component in accordance with the second exemplary embodiment of the invention (FIG. 4). In this exemplary embodiment the second diffusion step is omitted because the lower temination of the lower doping region 15 with an n-doped barrier layer (14 in FIG. 2) is dispensed with.

The missing barrier layer is in this case replaced in the edge region by a passivation layer 20 (for example of SiO2) which is depsited on the lower side 19 and which covers the whole width of the lower doping region 15 including the space charge region it produces. This saves a process step, but on the other hand, a complete burying of the lower doping region 15 is dispensed with.

Figure 5:
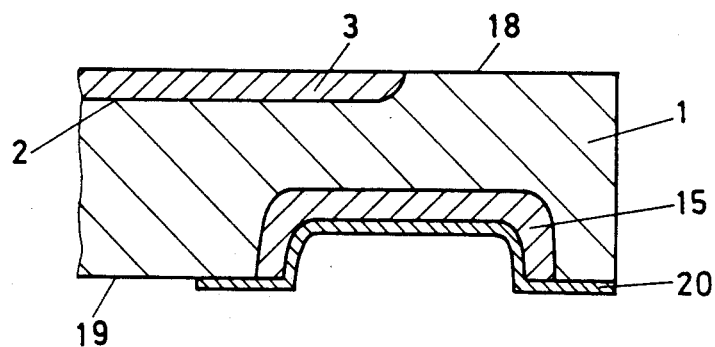
FIGS. 5 and 6 are cross-sectional views showing a third and fourth exemplary embodiments of a semiconductor component according to the invention.

Finally, in the third exemplary embodiment of FIG. 5 a trench 21 is first removed by etching at the appropriate point before the drive-in of the lower doping region 15 and the lower doping region 15 is then produced by diffusion into the floor and the side walls of the trench 21. This procedure has the advantage that the diffusion does not need to be as deep as in the case of FIG. 4, or the operation on the semiconductor substrate 1 from the lower side 19 can be carried out more deeply.

The structure of FIG. 5 may again by additionally supplemented, as in FIG. 2, by a barrier layer, not shown, which separates the lower doping region 15 from the trench 21 and the rest of the lower side 19.

Figure 6:
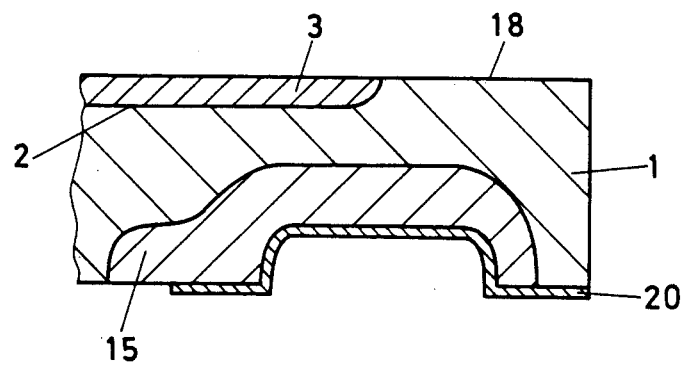

According to a fourth exemplary embodiment in FIG. 6, the lower doping region 15 may also be shaped as a step below the upper doping region 3. In this way, the expansion of the space charge region can be influenced with still more degrees of freedom and the field stength in the space charge region can be controlled better. Here, too, a barrier layer can again additionally be provided.

Altogether the invention makes available a semi-conductor component which has an increased breakdown strength without the disadvantages of known components and which is simple to realize.

Obviously it is within the scope of the invention to use other doping processes and doping materials known from semiconductor technology instead of the hot diffusion processes cited here, provided only that they are suitable for providing a lower doping region in a comparable system. Likewise it is also conceivable to provide other geometrical shapes of the doping regions.

What is claimed as new and desired to be secured by Letters Patent of the United States is:

1. Semiconductor component comprising:
   a doped semiconductor substrate of first conductivity type having a planar upper major surface and a lower major surface;
   an upper doping region of a second conductivity type opposite that of the substrate, said upper doping region projecting into the substrate from the upper major surface;
   said substrate and said upper doping region forming therebetween a P-N junction which emerges at the upper major surface at an edge region of the substrate defining by that an intersection region;
   a laterally delimited lower doping region of second conductivity type provided in order to reduce charges in the vicinity of the intersection region, said lower doping region projecting into the substrate from the lower major surface and terminating in the bulk of the substrate on a plane parallel to the upper major surface at a predetermined distance from the upper major surface;
   said lower doping region being located precisely below the intersection region; and
   a trench which projects from the lower major surface of the semiconductor substrate into the lower doping region;
   a passavation layer coating said trench and at least a part of the lower major surface.

2. Semiconductor component as claimed in claim 1, wherein the part of the lower doping region that laterally extends under the upper doping region is shaped in the form of a step.

3. Semiconductor component as claimed in claim 1, wherein the semiconductor substrate is lightly n-doped, the upper doping region is heavily p-doped and the lower doping region is p-doped.

* * * * *